United States Patent [19]
Takeuchi

[11] Patent Number: 5,517,589
[45] Date of Patent: May 14, 1996

[54] OPTICAL WAVELENGTH MULTIPLEXING AND DEMULTIPLEXING DEVICE FOR MULTIPLEXING OR DEMULTIPLEXING LIGHT HAVING A PLURALITY OF MODES AND PHOTODETECTOR USING THE SAME

[75] Inventor: Shinsuke Takeuchi, Yokohama, Japan

[73] Assignee: Canon Kabushiki Kaisha, Tokyo, Japan

[21] Appl. No.: 262,984

[22] Filed: Jun. 21, 1994

[30] Foreign Application Priority Data

Jun. 23, 1993 [JP] Japan .................................. 5-152260

[51] Int. Cl.$^6$ ...................................................... G02B 6/28
[52] U.S. Cl. ............................ 385/24; 359/116; 359/127; 385/28; 385/37
[58] Field of Search ............................. 385/11, 14–17, 385/27, 28, 37, 39, 50, 45, 129–132, 24; 359/115, 116, 122, 127, 130

[56] References Cited

U.S. PATENT DOCUMENTS

| | | | |
|---|---|---|---|
| 3,957,341 | 5/1976 | Taylor | 385/27 |
| 4,846,540 | 7/1989 | Kapon | 385/45 |
| 5,031,989 | 7/1991 | Morishita et al. | 385/27 |
| 5,243,672 | 9/1993 | Dragone | 385/17 X |
| 5,325,221 | 6/1994 | Van der Tol | 385/14 X |

FOREIGN PATENT DOCUMENTS

| | | |
|---|---|---|
| 386797 | 9/1990 | European Pat. Off. . |
| 2-239209 | 9/1990 | Japan . |
| 2-297505 | 12/1990 | Japan . |
| 4-234020 | 8/1992 | Japan . |
| 8906813 | 7/1989 | WIPO . |

OTHER PUBLICATIONS

Alferness, R. C., "Polarization Indpendent . . . TE⇌TM Conversion," Applied Physics Letters, vol. 39, No. 2, Jul. 15, 1981, pp. 131–134.

*Primary Examiner*—John D. Lee
*Attorney, Agent, or Firm*—Fitzpatrick, Cella, Harper & Scinto

[57] ABSTRACT

An optical wavelength multiplexing and demultiplexing device includes a first waveguide and a plurality of waveguides having different propagation constants. The first waveguide is caused to be coupled with the plurality of waveguides in different modes. The plurality of waveguides have different structures or different indices so as to provide different propagation constant from each another. According to the optical wavelength multiplexing and demultiplexing device, light components having various wavelengths and modes can be simultaneously multiplexed or demultiplexed.

35 Claims, 6 Drawing Sheets

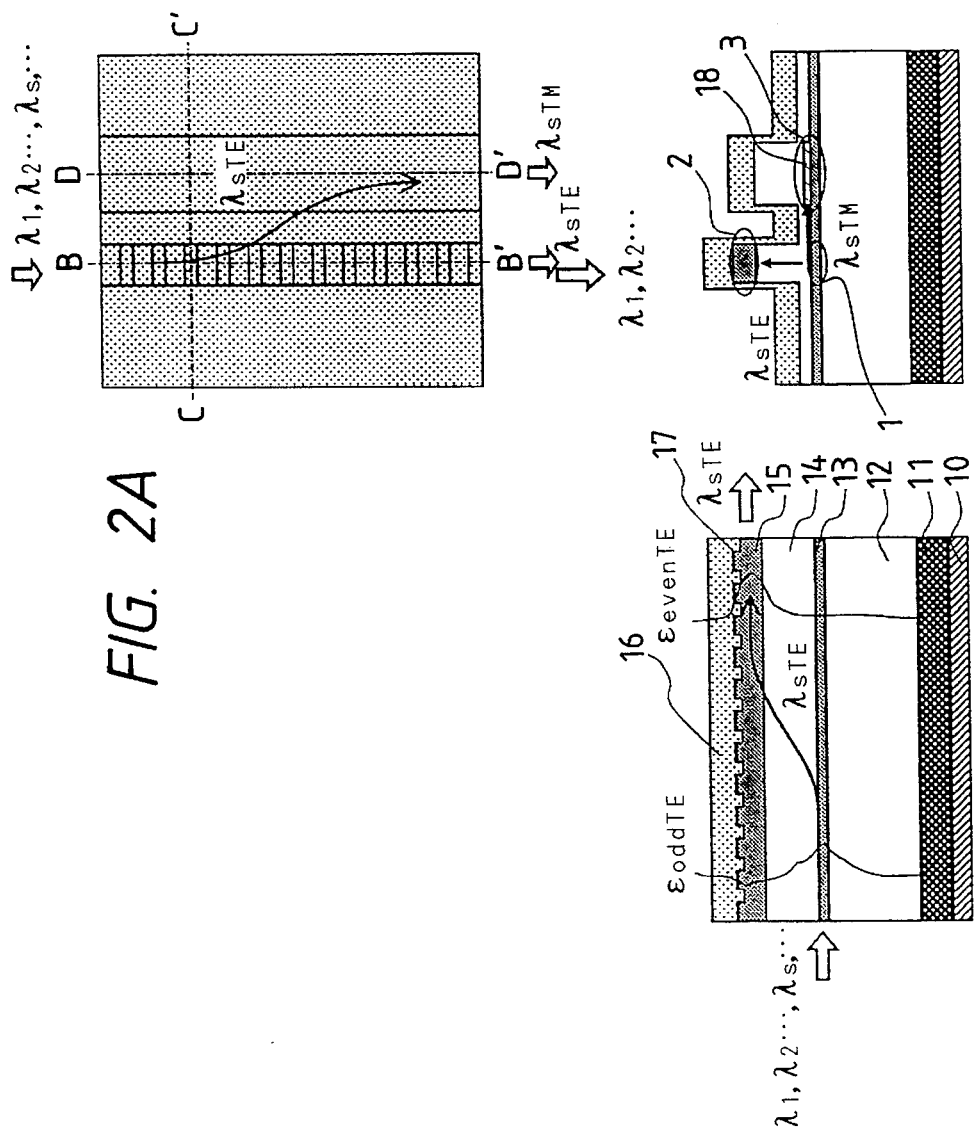

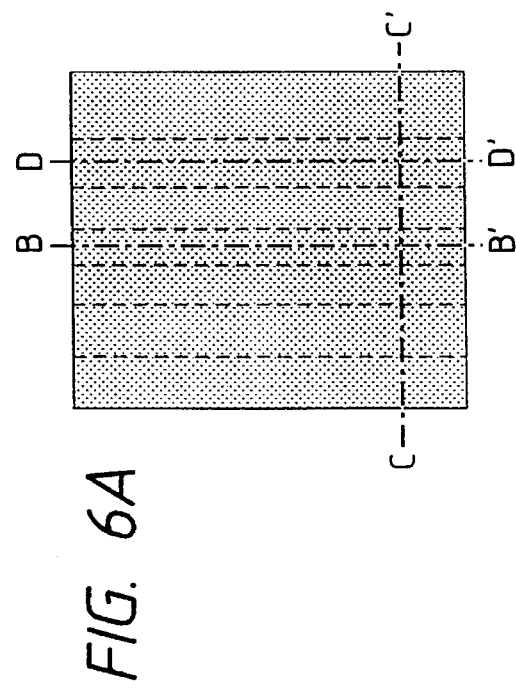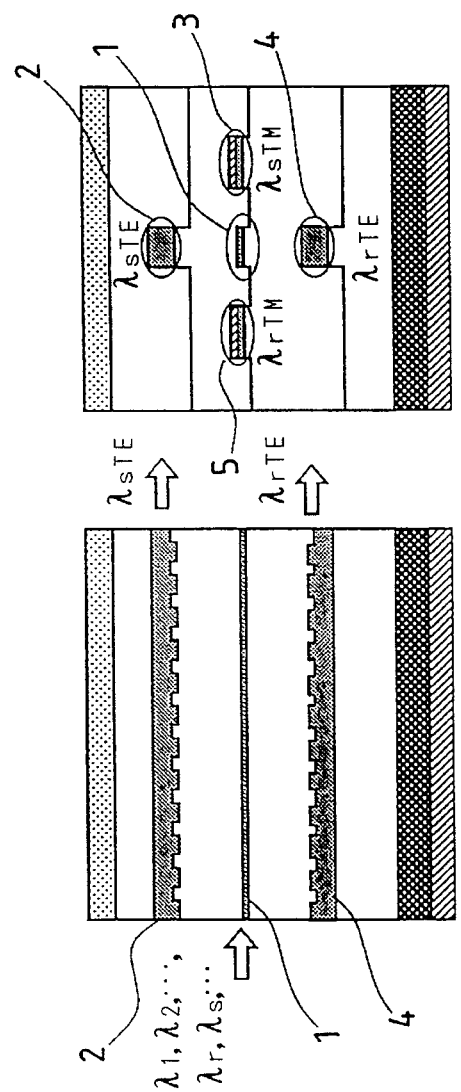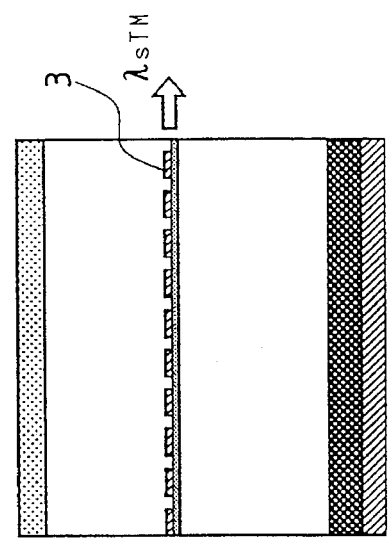
FIG. 6A
FIG. 6B
FIG. 6C
FIG. 6D

OPTICAL WAVELENGTH MULTIPLEXING AND DEMULTIPLEXING DEVICE FOR MULTIPLEXING OR DEMULTIPLEXING LIGHT HAVING A PLURALITY OF MODES AND PHOTODETECTOR USING THE SAME

BACKGROUND OF THE INVENTION

1. Field of the Invention

The present invention relates to an optical wavelength multiplexing and demultiplexing device used in optical communications and a photodetector using the same.

2. Related Background Art

A directional coupler having two asymmetrical waveguides and a grating, as described in Japanese Laid-Open Patent Application No. 2-239209 is proposed as a conventional optical wavelength multiplexing and demultiplexing device for multiplexing or demultiplexing an optical signal. Advantageous features of such an element are a pass band of about several nm, transmission of an optical signal having a nonfiltering wavelength, and the like. An odd mode $\epsilon_{odd}$ and an even mode $\epsilon_{even}$ having an electric field distribution shown in FIG. 1 are present in the directional coupler. The grating is used as a phase matching means for coupling these two modes.

As shown in FIG. 1, input signal light consists of wavelengths $\lambda_1, \lambda_2, \ldots, \lambda_e, \ldots, \lambda_n$. When this input signal light is incident on a first waveguide 1 serving as an input waveguide, it is coupled to the odd mode $\epsilon_{odd}$ and propagates. However, the TE-like component of the optical signal having the wavelength $\lambda_e$ satisfying the following equation with respect to a grating pitch $\Lambda$:

$$\beta_{oTE}(\lambda_e) - \beta_{eTE}(\lambda_e) = 2\pi/\Lambda \qquad (1)$$

is coupled to the even mode $\epsilon_{even}$, and the optical power shifts to a second waveguide 2 serving as a detection waveguide. As a result, wavelength demultiplexing is achieved to detect output signal light which is then transferred to another functional element.

In the above equation, $\beta_{oTE}(\lambda_e)$ and $\beta_{eTE}(\lambda_e)$ are propagation constants of the odd and even modes of the TE-like polarized components of the light wave having the wavelength $\lambda_e$.

The remaining wavelength and polarized components directly pass through the input waveguide and are transferred to the next stage.

When TM-like mode light having the wavelength $\lambda_m$ satisfying the following equation:

$$\beta_{oTM}(\lambda_m) - \beta_{eTM}(\lambda_m) = 2\pi/\Lambda \qquad (2)$$

is mixed in, this light is demultiplexed in the same manner as described above. When an optical output is to be detected immediately after demultiplexing, the S/N ratio may deteriorate. It is, however, easy to set a larger difference $|\lambda_m - \lambda_e|$ between these two wavelengths than the multiplexed wavelength range $\Delta\lambda$, i.e., $$|\lambda_m - \lambda_e| > \Delta\lambda \qquad (3)$$

thus posing no practical problem.

The TE- and TM-like modes (polarization) represent modes in which the electric field vectors point in directions parallel and perpendicular to the surface of the substrate, respectively.

According to the conventional example, however, only a specific polarized component having a specific wavelength can be demultiplexed. For this reason, when design is made to extract only TE-like wavelength components of the signal light, all the TM-like polarized light components are transferred to the next stage. That is, in wavelength multiplex communication, this design leads to a signal intensity loss.

An optical signal used in communication is generally transmitted through an optical fiber. A good polarized state of a signal input through a fiber cannot be guaranteed unless a polarization preservation fiber is used. Without the polarization preservation fiber, most of the polarized light components become random. In the worst case, all the optical signal components input to the wavelength demultiplexer become TM mode light components. As a result, a desired signal cannot be demultiplexed at all.

Even if the polarization preservation fiber is used, the phase of an electric field is shifted from that of a magnetic field over a long distance. The polarization plane is rotated, or incident light becomes elliptically polarized light.

When polarization is to be preserved, bending of a fiber at a small radius of rotation is not allowed in consideration of a phase shift in light waves caused by a stress. It is, however, almost impossible to perfectly preserve polarization in consideration of the fiber layout used in an optical LAN.

Both the polarization modes may be extracted by connecting a plurality of conventional elements described above along the light wave propagation direction. According to this method, however, the element length undesirably increases, and the transmission loss also increases.

This also applies to a case wherein multiwavelength light components are simultaneously multiplexed or demultiplexed.

In consideration of only polarization, when a medium has proper nonlinearity, it can cause a polarization mode shift from TE to TM or TM to TE. For this reason, there can be provided a polarization-free filter as described in R. C. Alferness et al., Applied Physics Letters, 39, P. 131 (1981). $LiNbO_3$ used in this filter is a material of this type having a high nonlinearity. Even with this material, a high coupling efficiency cannot be obtained, and the coupling length or the element length undesirably increases. As compared with a semiconductor material, this material is unsuitable for integration of an optoelectric integrated circuit (OEIC). A material of this type having a high nonlinearity is rarely found in semiconductor materials. Thus, there is not found any semiconductor material having a high nonlinearity and electrical characteristics suitable for an OEIC. As a method of extracting light components having various wavelengths and modes, there may be provided a method of parallelly arranging waveguides and arranging regions for coupling target light components between the waveguides from the light incident side, thereby demultiplexing each target light component in one of the regions. However, this method neither shorten the element length nor eliminate the propagation loss.

SUMMARY OF THE INVENTION

The present invention has been made in consideration of the conventional problems described above, and has as its object to provide an optical wavelength multiplexing and demultiplexing device suitable for simultaneously demultiplexing or multiplexing light components having various wavelengths and modes.

In order to achieve the above object according to an aspect of the present invention, there is provided an optical wavelength multiplexing and demultiplexing device for multiplexing or demultiplexing light in accordance with propagation of the light between waveguides, which device includes a first waveguide, a plurality of waveguides having different propagation constants, and coupling means for coupling the first waveguide and the plurality of waveguides in different modes.

According to another aspect of the present invention, there is provided a photodetector for demultiplexing and detecting light of a specific mode from light obtained by multiplexing light components of a plurality of modes, which device includes a first waveguide for receiving multiplexed light, a plurality of waveguides having different propagation constants, coupling means for coupling the first waveguide and the plurality of waveguides in different modes, and detecting means for detecting light demultiplexed by the coupling means.

BRIEF DESCRIPTION OF THE DRAWINGS

FIGS. 2A to 2D are views showing an optical wavelength multiplexing and demultiplexing device according to the first embodiment of the present invention;

FIGS. 6A to 6D are views showing an optical wavelength multiplexing and demultiplexing device according to the fourth embodiment of the present invention.

DETAILED DESCRIPTION OF THE PREFERRED EMBODIMENTS

First Embodiment

Figure 1:
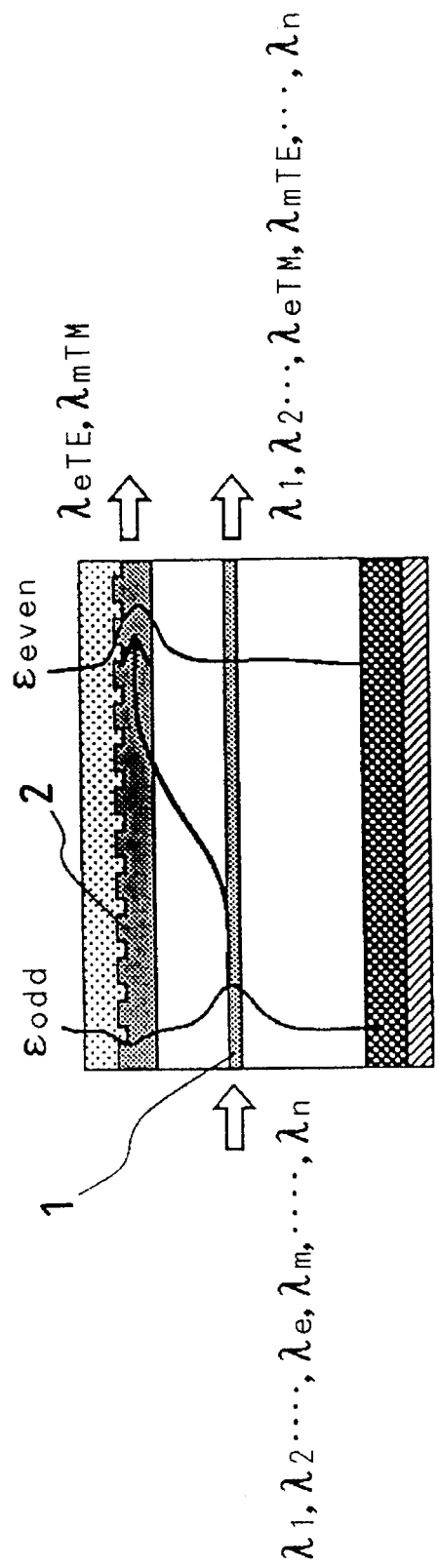
FIG. 1 is a schematic view showing a conventional optical wavelength multiplexing and demultiplexing device.

FIGS. 2A to 2D show the first embodiment in which second and third waveguides 2 and 3 are formed above and at the side, respectively, of a first waveguide 1 so that their coupling planes are perpendicular to each other to constitute a polarization-free optical wavelength demultiplexer. FIG. 2A is a plan view of the first embodiment, FIG. 2B is a sectional view thereof along the line B–B', FIG. 2C is a sectional view thereof along the line C–C', and FIG. 2D is a sectional view thereof along the line D–D'. In the first waveguide 1, input signal light is coupled to an odd mode $\epsilon_{oddTE}$ of a directional coupler of the first embodiment. The signal light has wavelengths $\lambda_1, \lambda_2, \ldots, \lambda_s, \ldots, \lambda_n$. This wavelength demultiplexer demultiplexes an optical signal having the wavelength $\lambda_s$. A TE-like mode optical signal having the wavelength $\lambda_s$ receives perturbation through a grating 16 having $\Lambda_{TE}(\lambda_s)$ defined as follows:

$$\beta_{oTE}(\lambda_s)-\beta_{eTE}(\lambda_s)=2\pi/\Lambda_{TE}(\lambda_s) \qquad (4)$$

so that the odd mode $\epsilon_{oddTE}$ is coupled to an even mode $\epsilon_{evenTE}$. As a result, the input signal light is demultiplexed to the second waveguide 2 by the first waveguide 1. Similarly, a TM-like mode optical signal receives perturbation through a grating 18 having $\Lambda_{TM}(\lambda_s)$ defined as follows:

$$\beta_{oTE}(\lambda_m)-\beta_{eTE}(\lambda_m)=2\pi/\Lambda_{TM}(\lambda_s) \qquad (5)$$

and is demultiplexed to the third waveguide 3 by the first waveguide 1.

In this element, complete coupling lengths $L_c$ for both the polarization modes, i.e., TE- and TM-like modes are designed to equal to each other, and the element length (in this embodiment, the waveguide length is equal to the element length) is set to $L_c$. An optical signal component having the wavelength $\lambda_s$ is absent in the output light from the first waveguide 1. The complete coupling length $L_c$ is defined as follows:

$$L_c=\pi/2G \qquad (6)$$

where G is the coupling coefficient between the even and odd modes.

For this reason, the coupling coefficients of these modes can be set equal to each other, so that the complete coupling lengths can be set equal to each other.

The coupling coefficient G can be changed by changing various conditions. The simplest method is to increase the depth of a grating to increase the coupling coefficient. This method is employed in the element of this embodiment. The various conditions include the shape and size of each waveguide, the interval between the adjacent waveguides, the refractive index of each layer, the duty ratio of the grating (i.e., the ratio of the length of a projection to that of a recess in a direction parallel to the waveguiding direction), the depth of the grating teeth, and the like. The means for adjusting the coupling coefficient will be described below to facilitate easy understanding of the present invention.

For the descriptive convenience, assume that two waveguides shown in FIG. 2B are slab waveguides. The coupling coefficient G is defined as follows, provided that the stacking direction is aligned with the x-axis:

$$G = \frac{\omega\epsilon_0}{8} \int \epsilon_{even} \Delta n_g(x)\epsilon_{odd}dx \qquad (7)$$

where $\epsilon_0$ is the dielectric constant in a vacuum, $\omega$ is the number of waves, $\Delta n_g$ is the Fourier coefficient representing a change in refractive index of the grating, given as follows.

$$\Delta n_g(x)=(n_1^2-n_2^2)/\{\pi\cdot\sin(\pi w/\Lambda)\}$$

(for x in the grating area)

$$\Delta n_g(x)=0$$

(for x outside the grating area) $\qquad (8)$ where $\Lambda$ is the pitch of the illustrated rectangular grating, w is the length of the projection of the grating which is measured in a direction parallel to the waveguiding direction, and $n_1$ and $n_2$ are the refractive indices of a core layer 15 and a cladding layer 16 of the second waveguide, respectively.

Figure 3B:
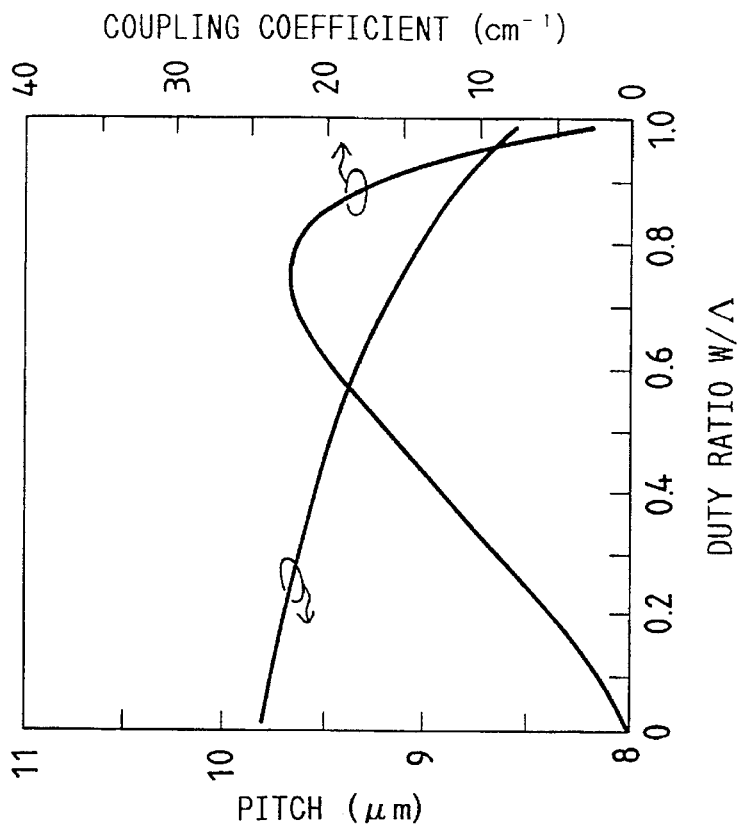
FIGS. 3A and 3B are graphs showing the characteristics of a diffraction grating.
Figure 3A:
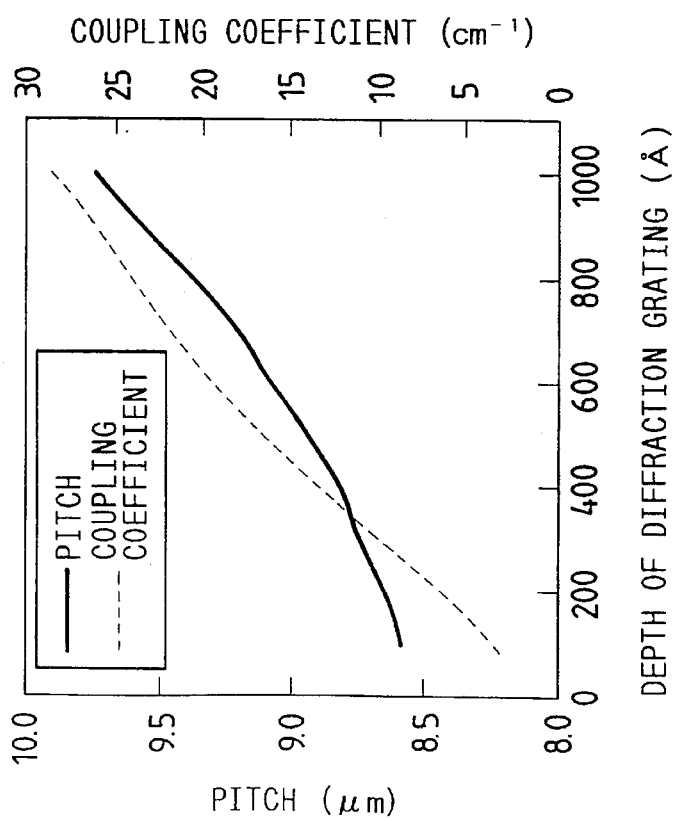

As can be apparent from equations (8), the integral area in equation (7) is only the grating area, i.e., the depth of the grating. For this reason, even in consideration of influences of the grating depth on the modes $\epsilon_{odd}$ and $\epsilon_{even}$, the coupling coefficient G increases with an increase in depth of the grating. This state is shown in FIG. 3A.

Calculations are made to demultiplex an optical signal having a wavelength of 830 nm under the following conditions. The refractive indices of a core layer 13 and the core layer 15 are set to 3.45 and 3.39, respectively. The thicknesses of the core layers 13 and 15 are set to 0.50 μm and 0.10 μm, respectively. The thickness of a cladding layer 14 between the two waveguides is set to 0.8 μm, and its refractive index is set to 3.29. The refractive indices of cladding layers 16 and 12 are set to 1.46 and 3.29, respectively, and their thicknesses are set infinite. The duty ratio w/Λ of the grating is set to 0.7. As may be apparent, with an increase in depth of the grating, the coupling coefficient increases, and at the same time, the corresponding grating pitch increases. FIG. 3B shows changes in coupling coefficient G and grating pitch Λ when the duty ratio w/Λ is changed while the grating depth is fixed to 0.07 μm in the above arrangement. The sin term in equation (8) becomes maximum when the ratio w/Λ is set to 0.5. In practice, the duty ratio for maximizing the coupling coefficient G is shifted to a larger w value, i.e., to a larger projection due to the following reason. A larger projection causes a higher refractive index, and thereby causing a higher electric field in the grating portion. This allows an increase in coupling coefficient G, as can be apparent from equation (7).

As described before, the coupling coefficient G can be changed by changing the size of a waveguide. However, in a directional coupler using asymmetrical waveguides so as to provide wavelength selectivity of about 2 nm, the electric field distribution of each waveguide is almost the same as that of the waveguide alone. This item has a smaller effect of changing the coupling coefficient G than those of the above two items.

In this element, the element length is defined as the complete coupling length $L_c$, and all the optical signals having the wavelength $\lambda_s$ are extracted from the input waveguide 1. This arrangement can obtain an output of, e.g., 3 dB.

When the element length is defined as L, the ratio of an output light intensity $P_{out}$ to an input light intensity $P_{in}$ is approximated as follows:

$$P_{out}/P_{in} \delta \sin(\pi L/2L_c)$$

When this relation is used, the above condition is satisfied when the element length L is set to $L_c/3$. In addition, when the depth of the grating is adjusted, all the optical signals of one mode and only half of the optical signals of the other mode can be extracted. When light components are incident on the waveguides 2 and 3, respectively, the element of this embodiment serves as an optical wavelength multiplexing and demultiplexing device, and multiplexes the light components. When the complete coupling length is set, all the light components can be multiplexed, thereby performing multiplexing and hence realizing a high multiplexing efficiency. The multiplexing ratio can be arbitrarily set as in demultiplexing.

When identical polarized light components are used in the element of this embodiment, multiwavelength multiplexing and demultiplexing can be performed, as a matter of course.

When the coupling planes of the first and second waveguides and the coupling planes of the first and third coupling planes are arranged perpendicular to each other, since the coupling planes are not identical to each other, overlapping of modes to be coupled can be particularly minimized.

Coupling between the second waveguide 2 and the third waveguide 3 is considered. In the element of this embodiment, no coupling occurs between these waveguides because a grating having a pitch satisfying the phase matching condition at the wavelength $\lambda_s$ is absent. Assuming an operation using optical signals having wavelengths which allow optical coupling, the coupling coefficient is very small to require a sufficiently long propagation distance as compared with $L_c$ so as to achieve optical coupling because overlapping of the electric field distributions of these two waveguides is very small.

A method of forming the element of this embodiment will be described below. A wafer of this element was formed by molecular beam epitaxy (MBE). A 0.5-μm thick GaAs buffer layer 11, a 1.5-μm thick AlGaAs cladding layer 12, a 0.1-μm thick GaAs/AlGaAs multiple quantum well (MQW) core layer 13 serving as a core portion of the first and third waveguides, and a 0.1-μm thick AlGaAs grating layer having the same refractive index as that of the core layer 13 were sequentially formed on a GaAs substrate 10. A grating 18 for coupling the first and third waveguides is formed by photolithography and reactive ion beam etching (RIBE), as shown in FIGS. 2C and 2D. A 0.8-μm thick AlGaAs cladding layer 14 having the same composition as that of the cladding layer 12, and a 0.4-μm thick GaAs/AlGaAs MQW core layer 15 serving as the core of the second waveguide were formed on the grating 18 by MOCVD. A grating 17 for coupling the first and second waveguides 1 and 2 was formed in a prospective portion as the second waveguide by resist mask formation using EB exposure and etching of the core layer 15 by RIBE. A 2-μm wide Ti mask was formed on the second waveguide on which the grating 17 was formed, and the channel waveguide 2 serving as the second waveguide was formed by performing RIBE etching until the AlGaAs cladding layer 14. A photoresist was masked on the third waveguide while the 2-μm wide Ti mask was left, and the two ridge waveguides 1 and 3 were simultaneously formed by RIBE. A 0.4-μm thick $Si_3N_4$ film 16 serving as a protective layer and a cladding layer was formed by plasma CVD, and both the ends of the element were cleaved at the length defining the coupling length $L_c$, thereby obtaining a device of this embodiment. The widths of the first, second, and third waveguides were set to 2 μm, 2 μm, and 3 μm, respectively.

Second Embodiment

Figures 4A, 4B, 4C, 4D:
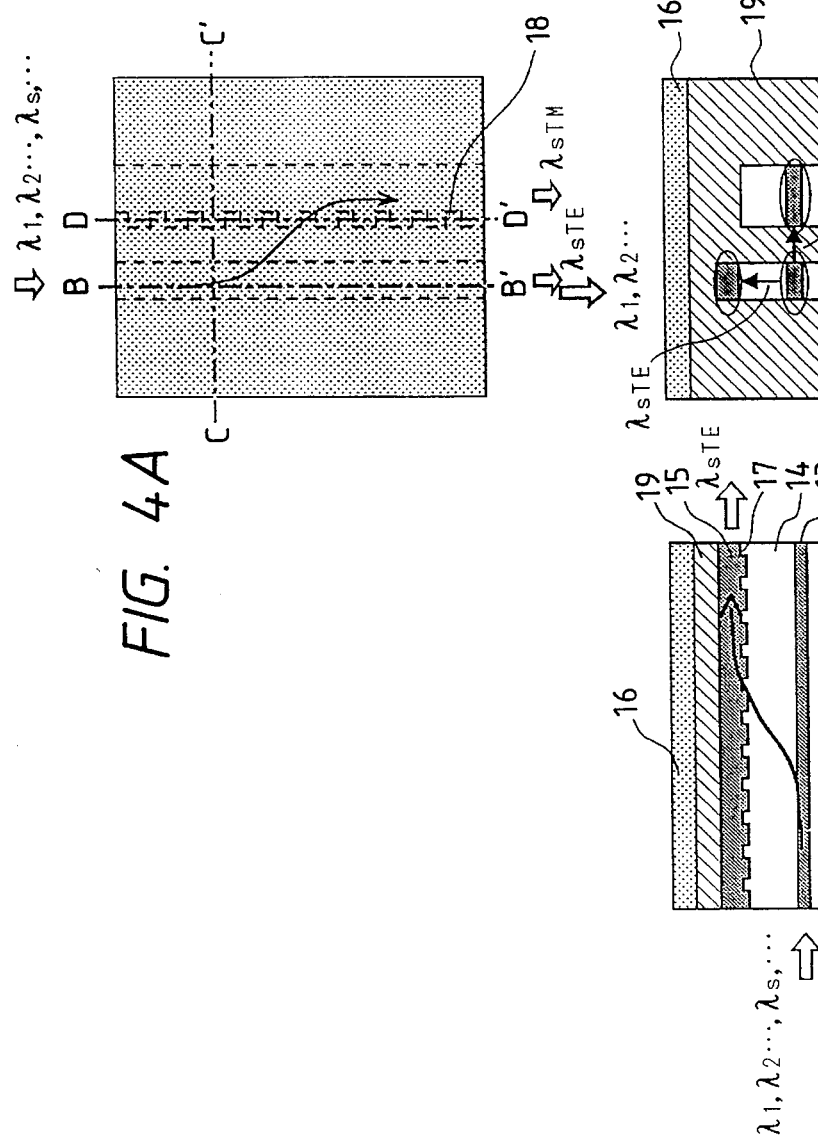
FIGS. 4A to 4D are views showing an optical wavelength multiplexing and demultiplexing device according to the second embodiment of the present invention.

FIGS. 4A to 4D show the second embodiment of the present invention. FIG. 4A is a plan view of the second embodiment, FIG. 4B is a sectional view thereof along the line B–B', FIG. 4C is a sectional view thereof along the line C–C', and FIG. 4D is a sectional view thereof along the line D–D'. In an element of this embodiment, a wafer was made by MBE. A 0.5-μm thick GaAs buffer layer 11, a 1.5-μm thick AlGaAs cladding layer 12, a 0.2-μm thick GaAs/AlGaAs MQW core layer 13 serving as the core portion of first and third waveguides 1 and 3, and a 0.8-μm thick AlGaAs cladding layer 14 were formed on a GaAs substrate 10. A grating 17 was formed on a wafer portion serving as the second waveguide by resist mask formation with EB exposure and RIBE etching of the cladding layer 14. After a 0.4-μm thick GaAs/AlGaAs MQW layer 15 serving as the core of the second waveguide 2 was regrown by MOCVD, a 2-μm wide Ti mask was formed on the second waveguide. RIBE etching was performed until the AlGaAs cladding layer 14 to form the channel waveguide 2 serving as the second waveguide. While the 2-μm wide Ti mask was left, a ridge mask with a grating 18 shown in FIGS. 4A and 4D was formed using a photoresist on the third waveguide by photolithography. The GaAs buffer layer 11 was etched by ultrahigh vacuum reactive ion beam etching (UHV-RIBE) having a high aspect ratio, thereby simultaneously forming the channel waveguide 1 and the channel waveguide 3 with a grating. An AlGaAs cladding layer 19 having the same composition as that of the cladding layers 12 and 14 was buried and regrown by metal organic chemical vapor deposition (MOCVD). A 0.4-μm thick $Si_3N_4$ film 16 serving as a protective film and a cladding layer was formed by plasma CVD, and both the ends of the element were cleaved at the length defining the coupling length $L_c$, thereby obtaining a device of this embodiment.

The operation of the element of this embodiment is the same as that of the first embodiment, except that the formation is slightly complicated as compared with the method of the first embodiment. Since the two gratings are located between the two waveguides to be coupled to each other, the coupling coefficient can be increased to shorten the coupling length, i.e., the overall element length. At the same time, geometric arrangements such as the waveguides, gratings, and electromagnetic distributions are the same with respect to both the modes, so that element design can be facilitated.

Third Embodiment

Figure 5A:
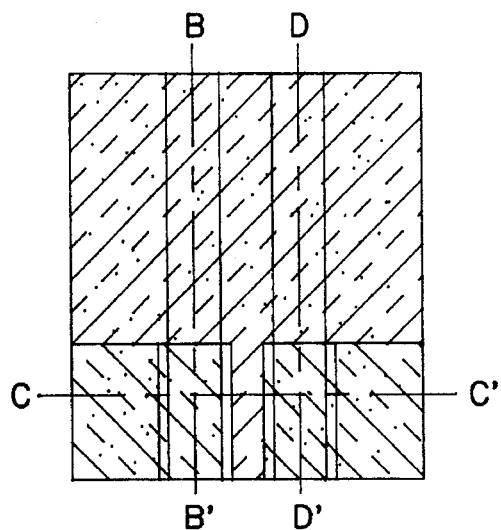
FIGS. 5A to 5D are views showing an optical wavelength multiplexing and demultiplexing device according to the third embodiment of the present invention.
Figure 5B:
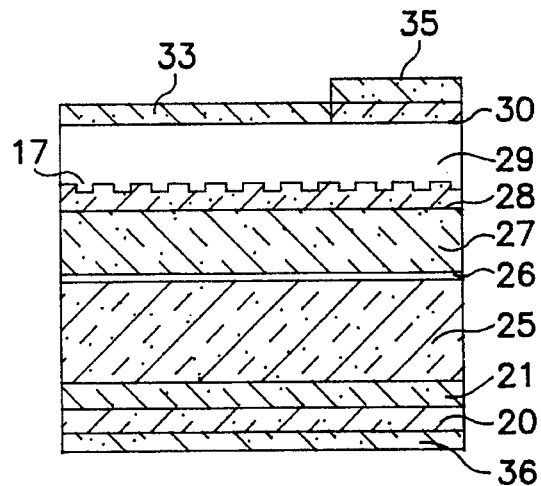
Figure 5C:
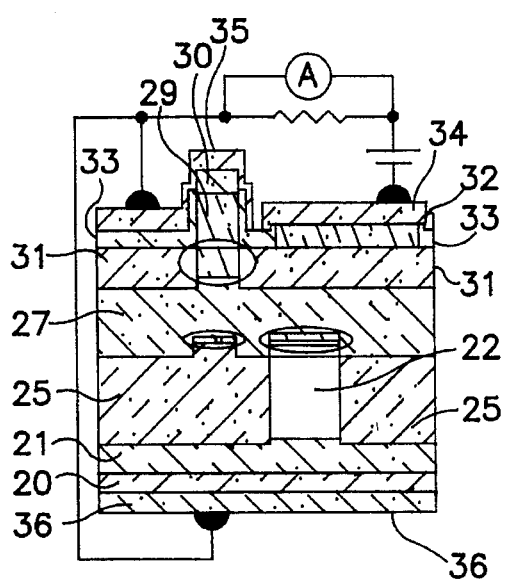
Figure 5D:
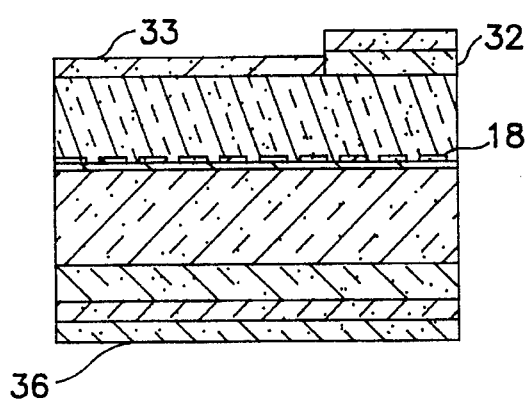

FIGS. 5A to 5D are views for realizing a photodetector for detecting an optical system having a specific wavelength independently of TE polarization and TM polarization according to the third embodiment of the present invention. FIG. 5A is a plan view of the third embodiment, FIG. 5B is a sectional view thereof along the line B–B', FIG. 5C is a sectional view thereof along the line C–C', and FIG. 5D is a sectional view thereof along the line D–D'.

Referring to FIGS. 5A to 5D, a wafer was formed by MBE. A 0.5-μm thick n-GaAs buffer layer 21, a 1.5-μm thick n-AlGaAs cladding layer 22, a 0.1-μm thick i-GaAs/AlGaAs MQW core layer 23 serving as a core of a third waveguide 3, and a 0.1-μm thick p-AlGaAs grating layer 24 having the same refractive index as that of the core layer 23 were formed on an n-GaAs substrate 20.

The grating layer 24 was etched by photolithography and RIBE to form a grating 18 for coupling the first and third waveguides shown in FIGS. 4C and 4D. RIBE etching was performed to form the channel waveguide 3 in the wafer portion serving as the third waveguide using an $SiO_2$ mask.

A p-AlGaAs cladding layer 25 having the same aluminum composition as that of the cladding layer 22 and a 0.1-μm thick p-GaAs/AlGaAs MQW core layer 26 serving as a core of the first waveguide 1 were selectively regrown by MOCVD using the $SiO_2$ mask. While leaving the $SiO_2$ mask, a photoresist mask was formed on the first waveguide 1 to perform RIBE etching until the cladding layer 25, thereby forming the channel waveguide 1. Then, the $SiO_2$ and the photoresist masks were removed. A p-AlGaAs cladding layer 27 having the same composition as that of the cladding layer 25 and a 0.4-μm thick i-GaAs/AlGaAs MQW core layer 28 for forming a core portion of the second waveguide 2 were regrown by MOCVD. A grating 17 for coupling the first and second waveguides 1 and 2 was formed on a wafer portion serving as the second waveguide by resist mask formation with EB exposure and RIBE etching of the core layer 28. A 1.2-μm thick n-AlGaAs cladding layer 29 having the same composition as that of the cladding layer 22 and a 0.5-μm thick n-GaAs contact layer 30 were sequentially regrown using MOCVD. RIBE etching was performed until the cladding layer 30 by photolithography and RIBE etching to form the channel waveguide 2. Thereafter, the contact layer 30 was selectively etched to reach the cladding layer 29 by photolithography and reactive ion etching (RIE), thereby forming an optical signal detection unit constituted by the second waveguide 2.

A p-AlGaAs cladding layer 31 having the same composition as those of the cladding layers 25 and 27 was regrown to the upper surface of the core layer 28 by MOCVD, and a 0.2-μm thick $SiO_2$ 33 serving as a protective film and an insulating film was sputtered and formed on the entire surface. A window was formed by photolithography and using an etching solution of hydrofluoric acid. A 0.5-μm thick p-GaAs common contact layer 32 as the optical signal detection unit of the second and third waveguides was formed using MOCVD again. A p-side Cr/Au electrode 34 and an n-side Au—Ge/Au second waveguide electrode 35 were formed by vacuum deposition, lift-off and annealing for achieving ohmic contact. The n-GaAs substrate 20 was lapped, and an n-side Au—Ge/Au third waveguide electrode 36 was formed by vacuum deposition and annealing. The resultant structure was cleaved to obtain an element. The element was wire-bonded.

The operation of the optical signal in the element of this embodiment is the same as that in the element of the first embodiment. However, in this third embodiment, the output terminal of each output waveguide is designed in a pin arrangement, and photodetection can be performed. In addition, design is made to set the complete coupling lengths for the TE- and TM-polarization modes equal to each other, thereby realizing a polalization free photodetector (photodetector free from TE-polarization and TM-polarization).

Fourth Embodiment

FIGS. 6A to 6D show the fourth embodiment of the present invention. A first waveguide 1 receives input signal light having wavelengths $\lambda_1, \lambda_2, \ldots, \lambda_r, \lambda_s, \ldots, \lambda_n$. An optical wavelength demultiplexing device of this embodiment demultiplexes optical signals having the wavelengths $\lambda_r$ and $\lambda_s$. Referring to FIGS. 6A to 6D, an optical signal of the TE-like mode having the wavelength $\lambda_s$ is demultiplexed by the first waveguide 1 to a second waveguide 2 located above the first waveguide 1. An optical signal of the TM-like mode having the wavelength $\lambda_s$ is demultiplexed to a third waveguide 3 to the right of the first waveguide 1. An optical signal of the TE-like mode having the wavelength $\lambda_r$ is demultiplexed by the first waveguide 1 to a fourth waveguide 4 located below the first waveguide 1. An optical signal of the TM-like mode having the wavelength $\lambda_r$ is demultiplexed to a fifth waveguide 5 to the left of the first waveguide 1.

Referring to FIGS. 6A to 6D, a wafer was formed by MEB. Regrowth was performed by MOCVD for four times. All the gratings and channel waveguides were formed by photolithography and RIBE.

In this element, the complete coupling lengths $L_c$ are equal to each other for all the modes. Matching between the TE-like polarization mode and the TM-like polarization mode is achieved by changing the depth and pitch of the grating, and matching between the wavelengths $\lambda_r$ and $\lambda_s$ is realized by changing the duty ratio and pitch of the grating.

In this embodiment, two-wavelength simultaneously polarization-free multiplexing and demultiplexing can be achieved.

As has been described above, according to the present invention, optical signals having various modes and wavelengths can be demultiplexed and multiplexed with the same coupling efficiency, i.e., at the same input/output ratio. Therefore, a polarization-free multiplexing and demultiplexing device and a simultaneous multiwavelength multiplexing and demultiplexing device can be provided. In addition, multiplexing and demultiplexing can be performed with a desired coupling efficiency.

What is claimed is:

1. An optical wavelength multiplexing and demultiplexing device for multiplexing or demultiplexing light in light propagation through waveguides, comprising:

a first waveguide;

a plurality of waveguides having different propagation constants, said plurality of waveguides comprising at least second and third waveguides, and a first coupling plane defined by central axes of said first and second waveguides being different from a second coupling plane defined by central axes of said first and third waveguides; and coupling means for coupling said first waveguide and said plurality of waveguides in different modes.

2. A device according to claim 1, wherein the propagation constants of said plurality of waveguides are different from each other by differentiating structures, refractive indices, or both the structures and the refractive indices of said plurality of waveguides.

3. A device according to claim 1, wherein the first and second coupling planes are perpendicular to each other.

4. A device according to claim 1, wherein the first coupling plane is parallel to a stacking direction.

5. A device according to claim 1, wherein a mode coupled in said first and second waveguides and a mode coupled in said first and third waveguides are orthogonal polarized components having a given wavelength.

6. A device according to claim 5, wherein the polarized components perpendicular to each other are a TE-like mode and a TM-like mode.

7. A device according to claim 1, wherein said plurality of waveguides further comprise fourth and fifth waveguides, a first coupling plane being defined by central axes of said first, second and fourth waveguides and a second coupling plane being defined by central axes of said first, third and fifth waveguides, and said first coupling plane is perpendicular to said second coupling plane and said first coupling plane is parallel with a stacking direction.

8. A device according to claim 7, wherein four modes coupled in said first waveguide and said second to fifth waveguides are orthogonal polarized components having two given wavelengths.

9. A device according to claim 1, wherein said coupling means performs coupling using perturbation using a diffraction grating.

10. A device according to claim 9, wherein a diffraction grating surface is perpendicular to a plane formed by central lines of two coupled waveguides in a light propagation direction.

11. A device according to claim 9, wherein each mode coupled between waveguides is set in accordance with a pitch of said diffraction grating.

12. A device according to claim 9, wherein a coupling ratio of modes coupled between waveguides is determined by a depth of said diffraction grating.

13. A device according to claim 9, wherein a coupling ratio of modes coupled between waveguides is determined by a ratio of a length of a projection to that of a recess of said diffraction grating in a waveguide direction.

14. A device according to claim 9, wherein said first waveguide and said plurality of waveguides have equal waveguide lengths which constitute a complete coupling length in which all light components of modes coupled between waveguides are coupled to each other.

15. A device according to claim 14, wherein modes coupled between waveguides are set in accordance with a pitch of said diffraction grating, and the waveguide lengths are set to become the complete coupling length by adjusting a depth of said diffraction grating.

16. A device according to claim 14, wherein modes coupled between waveguides are set in accordance with a depth of said diffraction grating, and the waveguide lengths are set to become the complete coupling length by adjusting a ratio of a length of a projection to that of a recess of said diffraction grating.

17. A device according to claim 9, wherein said diffraction grating is provided between said first waveguide and each of said plurality of waveguides.

18. A photodetector for demultiplexing and detecting light of a specific mode from light obtained by multiplexing light components of a plurality of modes, comprising:

a first waveguide into which multiplexed light is input;

a plurality of waveguides having different propagation constants, said plurality of waveguides comprising at least second and third waveguides, and a first coupling plane defined by central axes of said first and second waveguides being different from a second coupling plane defined by central axes of said first and third waveguides;

coupling means for coupling said first waveguide and said plurality of waveguides in different modes; and detecting means for detecting light demultiplexed by said coupling means.

19. A photodetector according to claim 18, wherein said detecting means detects light by setting said plurality of waveguides in a pin structure.

20. A photodetector according to claim 18, wherein the propagation constants of said plurality of waveguides are different from each other by differentiating structures, refractive indices, or both the structures and the refractive indices of said plurality of waveguides.

21. A photodetector according to claim 18, wherein the first and second coupling planes are perpendicular to each other.

22. A photodetector according to claim 18, wherein the first coupling plane is parallel to a stacking direction.

23. A photodetector according to claim 18, wherein a mode coupled in said first and second waveguides and a mode coupled in said first and third waveguides are orthogonal polarized components having a given wavelength.

24. A photodetector according to claim 23, wherein the polarized components perpendicular to each other are a TE-like mode and a TM-like mode.

25. A photodetector according to claim 1, wherein said plurality of waveguides further comprise fourth and fifth waveguides, a first coupling plane being defined by central axes of said first, second and fourth waveguides and a second coupling plane being defined by central axes of said first, third and fifth waveguides, and said first coupling plane is perpendicular to said second coupling plane and said first coupling plane is parallel with a stacking direction.

26. A photodetector according to claim 25, wherein four modes coupled in said first waveguide and said second to fifth waveguides are orthogonal polarized components having two given wavelengths.

27. A photodetector according to claim 18, wherein said coupling means performs coupling using perturbation using a diffraction grating.

28. A photodetector according to claim 27, wherein a diffraction grating surface is perpendicular to a plane formed by central lines of two coupled waveguides in a light propagation direction.

29. A photodetector according to claim 27, wherein each mode coupled between waveguides is set in accordance with a pitch of said diffraction grating.

30. A photodetector according to claim 27, wherein a coupling ratio of modes coupled between waveguides is determined by a depth of said diffraction grating.

31. A photodetector according to claim 27, wherein a coupling ratio of modes coupled between waveguides is determined by a ratio of a length of a projection to that of a recess of said diffraction grating in a waveguide direction.

32. A photodetector according to claim 27, wherein said first waveguide and said plurality of waveguides have equal waveguide lengths which constitute a complete coupling length in which all light components of modes coupled between waveguides are coupled to each other.

33. A photodetector according to claim 32, wherein modes coupled between waveguides are set in accordance with a pitch of said diffraction grating, and the waveguide lengths are set to become the complete coupling length by adjusting a depth of said diffraction grating.

34. A photodetector according to claim 32, wherein modes coupled between waveguides are set in accordance with a depth of said diffraction grating, and the waveguide lengths are set to become the complete coupling length by adjusting a ratio of a length of a projection to that of a recess of said diffraction grating.

35. A photodetector according to claim 27, wherein said diffraction grating is provided between said first waveguide and each of said plurality of waveguides.

* * * * *

UNITED STATES PATENT AND TRADEMARK OFFICE
CERTIFICATE OF CORRECTION

PATENT NO. : 5,517,589        Page 1 of 2
DATED :      May 14, 1996
INVENTOR(S) : Shinsuke TAKEUCHI It is certified that error appears in the above-indentified patent and that said Letters Patent is hereby corrected as shown below:

ON THE TITLE PAGE - ITEM [56] - References Cited - U.S. PATENT DOCUMENTS:

"Indpendent" should read --Independent--.

ON THE TITLE PAGE - ITEM [57] - ABSTRACT:

Line 7, "constant from each another." should read --constants from each other.--

COLUMN 2:

Line 54, "shorten" should read --shortens-- and "eliminate" should read --eliminates--.

COLUMN 3:

Line 67, "$\beta_{oTE}(\lambda_m) - \beta_{cTE}(\lambda_m) = 2\pi/\Lambda_{TM}(\lambda_s) \ldots (5)$" should read --$\beta_{oTM}(\lambda_m) - \beta_{cTM}(\lambda_m) = 2\pi/\Lambda_{TM}(\lambda_s) \ldots (5)$--.

COLUMN 5:

Line 33, "$P_{out}/P_{in} \delta \sin(\pi L/2L_c)$" should read --$P_{out}/P_{in} \cong \sin(\pi L/2L_c)$--.

UNITED STATES PATENT AND TRADEMARK OFFICE
CERTIFICATE OF CORRECTION

PATENT NO. : 5,517,589
DATED : May 14, 1996
INVENTOR(S) : Shinsuke TAKEUCHI

It is certified that error appears in the above-indentified patent and that said Letters Patent is hereby corrected as shown below:

COLUMN 6:

Line 51, "until" should read --on--.

COLUMN 7:

Line 52, "until" should read --on--; and,
Line 61, "SiO$_2$ 33" should read --SiO$_2$ film 33--.

COLUMN 8:

Line 14, "polalization" should read --polarization--.

COLUMN 10:

Line 32, "claim 1," should read --claim 18,--; and,
Line 33, "comprise" should read --comprises--.

Signed and Sealed this

Twenty-ninth Day of October 1996

*Attest:*

BRUCE LEHMAN

*Attesting Officer*   *Commissioner of Patents and Trademarks*